(12) United States Patent
Cao (10) Patent No.: US 9,369,114 B2
(45) Date of Patent: Jun. 14, 2016

(54) EMI CONTROL METHOD AND APPARATUS, AND ELECTRONIC DEVICE

(71) Applicant: Huawei Technologies Co., Ltd., Shenzhen (CN)

(72) Inventor: Jincan Cao, Nanjing (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 14/562,003

(22) Filed: Dec. 5, 2014

(65) Prior Publication Data

US 2015/0171842 A1 Jun. 18, 2015

(30) Foreign Application Priority Data

Dec. 6, 2013 (CN) .......................... 2013 1 0656587

(51) Int. Cl.
*H03K 5/13* (2014.01)
*H03K 5/01* (2006.01)

(52) U.S. Cl.
CPC ........................................ *H03K 5/01* (2013.01)

(58) Field of Classification Search
USPC .................................................. 327/231–233
See application file for complete search history.

(56) References Cited

U.S. PATENT DOCUMENTS 8,094,115 B2 * 1/2012 Lin .......................... G09G 3/20
327/231

* cited by examiner

*Primary Examiner* — An Luu
(74) *Attorney, Agent, or Firm* — Conley Rose, P.C.; Grant Rodolph (57) ABSTRACT

An electromagnetic interference (EMI) control method to adjust initial clock phases of radiation sources of an electronic device, so as to control EMI of the electronic device. The EMI control method includes determining positions of radiation sources; determining a preset angle of the radiation sources; calculating an initial phase difference by position between the radiation sources according to the positions of the radiation sources and the preset angle of the radiation sources; calculating, according to the initial phase difference by position, determined initial clock phases of the radiation sources when a far-field superimposed field strength is a limiting value; and configuring a phase-adjustable clock driver of the electronic device using the determined initial clock phases, so as to adjust initial clock phases of the radiation sources to the determined initial clock phases.

14 Claims, 5 Drawing Sheets

EMI CONTROL METHOD AND APPARATUS, AND ELECTRONIC DEVICE

CROSS-REFERENCE TO RELATED APPLICATION

This application claims priority to Chinese Patent Application No. 201310656587.7, filed on Dec. 6, 2013, which is hereby incorporated by reference in its entirety.

TECHNICAL FIELD

The present invention relates to the communications field, and in particular, to an electromagnetic interference (EMI) control method and apparatus, and an electronic device.

BACKGROUND

Electronic and electrical products are increasingly applied in people's lives; impact of an electronic and electrical product on another electronic and electrical product during operation needs to be considered. In addition, attention needs to be further paid to impact of electromagnetic radiation on human health. Electromagnetic radiation specifications and requirements for electronic and electrical devices have become one of market access standards of countries and regions. At present, EMI of an entire system is controlled mainly in two manners, so that electromagnetic wave energy radiated by the entire system to the outside is suppressed.

The first manner is, after hardware design of a board is completed, a metal shielding enclosure is customized, so as to form a Faraday cage to improve performance of controlling EMI of the entire system. However, costs of customizing a metal Faraday cage is high; in addition, to achieve a better shielding effect, a small quantity of holes are disposed in the Faraday cage, which affects heat dissipation of the board.

The second manner is, a customized wave-absorbing material is used to shield and attenuate a radiation source of a board. However, in existing design, an installation area on a surface of the radiation source and around the radiation source is limited. The wave-absorbing material needs to provide very strong wave-absorbing performance, which also results in high costs of the wave-absorbing material.

SUMMARY

An EMI control method and apparatus, and an electronic device are provided, which may control EMI of an electronic device without affecting heat dissipation of the electronic device.

In a first aspect, an electromagnetic interference control method is provided, which is used to control electromagnetic interference of an electronic device, where the electronic device includes a board, at least two radiation sources, and a phase-adjustable clock driver, the at least two radiation sources and the phase-adjustable clock driver are disposed on the board, and the method includes determining positions of the at least two radiation sources on the board; determining a preset angle of the at least two radiation sources; calculating an initial phase difference by position between the at least two radiation sources according to the positions of the at least two radiation sources on the board and the preset angle of the at least two radiation sources; calculating, according to the initial phase difference by position between the at least two radiation sources, determined initial clock phases of the at least two radiation sources when a far-field superimposed field strength is a limiting value; and configuring the phase-adjustable clock driver using the determined initial clock phases.

In a first possible implementation manner of the first aspect, the electronic device further includes a wave-absorbing material, the wave-absorbing material is disposed on a first side of the board, and when the preset angle is an angle relative to a direction of the wave-absorbing material, determined initial clock phases of the at least two radiation sources when the far-field superimposed field strength is a maximum limiting value are calculated, so that electromagnetic waves that exceed a standard frequency and that are radiated by the at least two radiation sources are absorbed by the wave-absorbing material.

In a second possible implementation manner of the first aspect, the electronic device further includes an enclosure, the board is disposed inside the enclosure, the enclosure is provided with a heat dissipation hole, and when the preset angle is an angle relative to a direction of the heat dissipation hole, determined initial clock phases of the at least two radiation sources when the far-field superimposed field strength is a minimum limiting value are calculated, so as to prevent electromagnetic waves that exceed a standard frequency and that are of the at least two radiation sources from being radiated through the heat dissipation hole of the enclosure.

With reference to the second possible implementation manner of the first aspect, in a third possible implementation manner, the enclosure includes a first side wall and a second side wall, the first side wall is corresponding to a second side of the board, and the second side wall is corresponding to a third side of the board; the heat dissipation hole includes a first-side-wall heat dissipation hole and a second-side-wall heat dissipation hole, the first-side-wall heat dissipation hole is disposed in the first side wall, and the second heat dissipation hole is disposed in the second side wall; the preset angle includes a first angle and a second angle, the first angle is an angle relative to a direction of the first-side-wall heat dissipation hole, and the second angle is an angle relative to a direction of the second-side-wall heat dissipation hole; and further a far-field superimposed field strength formula includes a first weight value and a second weight value, the first weighted value is corresponding to the first angle, the second weight value is corresponding to the second angle, the first weight value and the second weight value are constants, and when a hole diameter of the first-side-wall heat dissipation hole is greater than a hole diameter of the second-side-wall heat dissipation hole, the first weight value is greater than the second weight value.

In a fourth possible implementation manner of the first aspect, after the calculating, according to the initial phase difference by position between the at least two radiation sources, determined initial clock phases of the at least two radiation sources when a far-field superimposed field strength is a limiting value, the method further includes collecting statistics on delays from the phase-adjustable clock driver to the at least two radiation sources; and the calculating, according to the initial phase difference by position between the at least two radiation sources, determined initial clock phases of the at least two radiation sources when a far-field superimposed field strength is a limiting value includes calculating, according to the initial phase difference by position between the at least two radiation sources and the delays from the phase-adjustable clock driver to the at least two radiation sources, the determined initial clock phases of the at least two radiation sources when the far-field superimposed field strength is the limiting value.

In a second aspect, an electromagnetic interference control apparatus is provided, which is configured to control electromagnetic interference of an electronic device, where the electronic device includes a board, at least two radiation sources, and a phase-adjustable clock driver, where the at least two radiation sources and the phase-adjustable clock driver are disposed on the board, and the apparatus includes a determining module configured to determine positions of the at least two radiation sources on the board, and determine a preset angle of the at least two radiation sources; a calculating module configured to calculate an initial phase difference by position between the at least two radiation sources according to the positions of the at least two radiation sources on the board and the preset angle of the at least two radiation sources, and calculate determined initial clock phases of the at least two radiation sources when a far-field superimposed field strength is a limiting value; and a configuring module configured to configure the phase-adjustable clock driver using the determined initial clock phases.

In a first possible implementation manner of the second aspect, the electronic device further includes a wave-absorbing material, the wave-absorbing material is disposed on a first side of the board, and the preset angle is an angle relative to a direction of the wave-absorbing material; and the calculating module is configured to calculate determined initial clock phases of the at least two radiation sources when the far-field superimposed field strength is a maximum value, so that electromagnetic waves that exceed a standard frequency and that are of the at least two radiation sources are absorbed by the wave-absorbing material.

In a second possible implementation manner of the second aspect, the electronic device further includes an enclosure, the board is disposed inside the enclosure, the enclosure is provided with a heat dissipation hole, and the preset angle is an angle relative to a direction of the heat dissipation hole; and the calculating module is configured to calculate determined initial clock phases of the at least two radiation sources when the far-field superimposed field strength is a minimum value, so as to prevent electromagnetic waves that exceed a standard frequency and that are of the at least two radiation sources from being radiated, through the heat dissipation hole, out of the enclosure.

In a third possible implementation manner of the second aspect, the apparatus further includes a statistics collecting module configured to collect statistics on delays from the phase-adjustable clock driver to the at least two radiation sources; and the calculating module is further configured to calculate, according to the initial phase difference by position between the at least two radiation sources and the delays from the phase-adjustable clock driver to the at least two radiation sources, the determined initial clock phases of the at least two radiation sources when the far-field superimposed field strength is the limiting value.

In a third aspect, an electronic device is provided, which includes an enclosure, a board, at least two radiation sources, a phase-adjustable clock driver, a wave-absorbing material, and a electromagnetic interference control apparatus, where the board, the at least two radiation sources, the phase-adjustable clock driver, the wave-absorbing material, and the electromagnetic interference control apparatus are disposed inside the enclosure; the at least two radiation sources, the phase-adjustable clock driver, and the electromagnetic interference control apparatus are disposed on the board, and the enclosure is provided with a heat dissipation hole; the wave-absorbing material is located between a surface that is of the enclosure and has no heat dissipation hole and a first side of the board, so as to absorb electromagnetic waves radiated by the at least two radiation sources; and the phase-adjustable clock driver is connected to the at least two radiation sources, and is configured to adjust initial clock phases of the at least two radiation sources.

In a first possible implementation manner of the third aspect, the electromagnetic interference control apparatus is configured to control electromagnetic interference of the electronic device, and includes a determining module configured to determine positions of the at least two radiation sources on the board, and determine a preset angle of the at least two radiation sources; a calculating module configured to calculate an initial phase difference by position between the at least two radiation sources according to the positions of the at least two radiation sources on the board and the preset angle of the at least two radiation sources, and calculate determined initial clock phases of the at least two radiation sources when a far-field superimposed field strength is a limiting value; and a configuring module configured to configure the phase-adjustable clock driver using the determined initial clock phases.

According to the first possible implementation manner of the third aspect, in a second possible implementation manner of the third aspect, the preset angle is an angle relative to a direction of the wave-absorbing material; and the calculating module is configured to calculate determined initial clock phases of the at least two radiation sources when the far-field superimposed field strength is a maximum limiting value, so that electromagnetic waves that exceed a standard frequency and that are of the at least two radiation sources are absorbed by the wave-absorbing material.

According to the first possible implementation manner of the third aspect, in a third possible implementation manner of the third aspect, the enclosure is provided with a heat dissipation hole, the preset angle is an angle relative to a direction of the heat dissipation hole; and the calculating module is configured to calculate determined initial clock phases of the at least two radiation sources when the far-field superimposed field strength is a minimum limiting value, so as to prevent electromagnetic waves that exceed a standard frequency and that are of the at least two radiation sources from being radiated, through the heat dissipation hole, out of the enclosure.

According to the first possible implementation manner of the third aspect, in a third possible implementation manner of the third aspect, the electromagnetic interference control apparatus further includes a statistics collecting module configured to collect statistics on delays from the phase-adjustable clock driver to the at least two radiation sources; and the calculating module is further configured to calculate, according to the initial phase difference by position between the at least two radiation sources and the delays from the phase-adjustable clock driver to the at least two radiation sources, the determined initial clock phases of the at least two radiation sources when the far-field superimposed field strength is the limiting value.

According to the electromagnetic interference control method provided by the embodiments of the present invention, positions of at least two radiation sources on a board are determined; a preset angle of the at least two radiation sources is determined; an initial phase difference by position between the at least two radiation sources is calculated according to the positions of the at least two radiation sources on the board and the preset angle of the at least two radiation sources; determined initial clock phases of the at least two radiation sources when a far-field superimposed field strength is a limiting value are calculated according to the initial phase difference by position between the at least two radiation sources; and a phase-adjustable clock driver is configured according to the determined initial clock phases, so as to adjust initial clock phases of the at least two radiation sources to the determined initial clock phases, which implements adjustment of the initial clock phases of the radiated sources, thereby completing EMI control of an electronic device.

BRIEF DESCRIPTION OF DRAWINGS

To describe the technical solutions in the embodiments of the present invention more clearly, the following briefly introduces the accompanying drawings required for describing the embodiments. The accompanying drawings in the following description show merely some embodiments of the present invention, and a person of ordinary skill in the art may still derive other drawings from these accompanying drawings without creative efforts.

DESCRIPTION OF EMBODIMENTS

The following clearly describes the technical solutions in the embodiments of the present invention with reference to the accompanying drawings in the embodiments of the present invention. The described embodiments are merely a part rather than all of the embodiments of the present invention. All other embodiments obtained by a person of ordinary skill in the art based on the embodiments of the present invention without creative efforts shall fall within the protection scope of the present invention.

Figure 1:
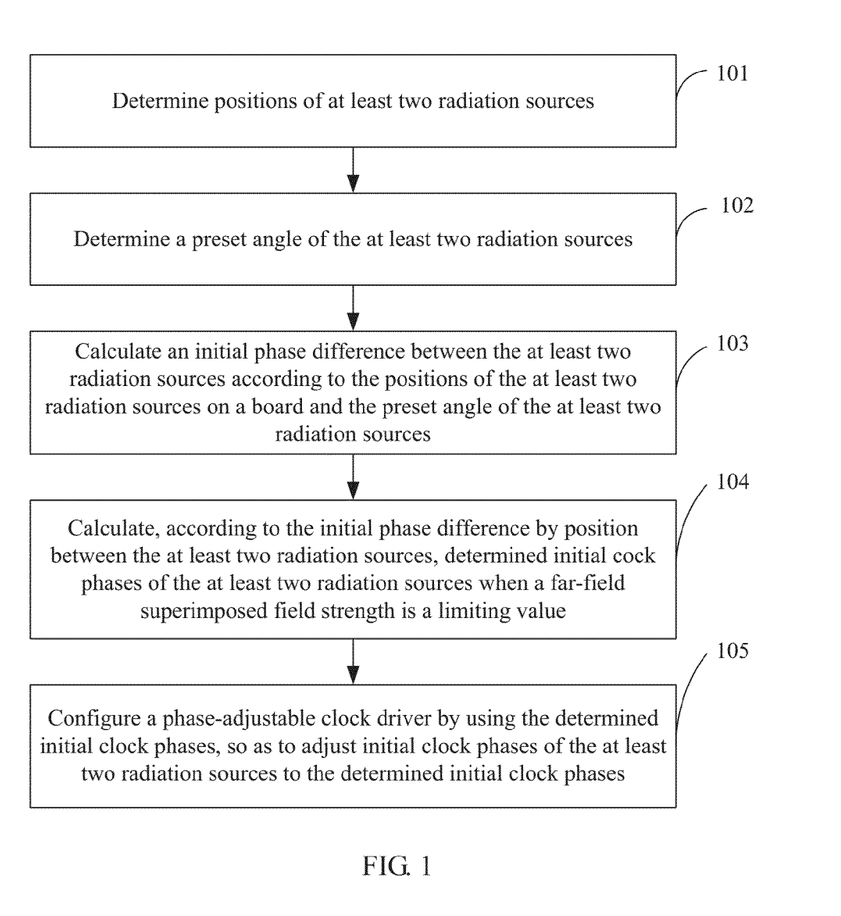
FIG. 1 is a flowchart of an EMI control method according to an embodiment of the present invention.

Referring to FIG. 1, an embodiment of the present invention provides an EMI control method, which is used to control EMI of an electronic device. The electronic device includes a board, at least two radiation sources, and a phase-adjustable clock driver, where the at least two radiation sources and the phase-adjustable clock driver are disposed on the board. The EMI control method includes the following:

101. Determine positions of the at least two radiation sources on the board.

The at least two radiation sources may be radiating components such as central processing units. The at least two radiation sources are disposed on the board. An X-Y axis coordinate system is established on a plane of the board. The at least two radiation sources have corresponding coordinates in the coordinate system, so that positions of the at least two radiation sources relative to the origin of the X-Y axis coordinate system may be determined.

102. Determine a preset angle of the at least two radiation sources.

In this implementation manner, the electronic device includes a wave-absorbing material and an enclosure, where the board is disposed inside the enclosure. The wave-absorbing material is disposed on a first side of the board. The enclosure is provided with a heat dissipation hole, which is configured to implement convection of air inside and outside the enclosure, so as to perform heat dissipation on the electronic device. The preset angle may be an angle relative to a direction of the wave-absorbing material. That is, the preset angle is an included angle between a direction of a normal line of X-Y axes and the direction of the wave-absorbing material. The preset angle may also be an angle relative to a direction of the heat dissipation hole. That is, the preset angle is an included angle between the direction of the normal line of the X-Y axes and the direction of the heat dissipation hole.

103. Calculate an initial phase difference by position between the at least two radiation sources according to the positions of the at least two radiation sources on the board and the preset angle of the at least two radiation sources.

The initial phase difference by position between the at least two radiation sources is calculated according to the positions of the at least two radiation sources on the board, the preset angle of the at least two radiation sources, and an initial phase difference by position formula.

The initial phase difference by position formula is $\phi=2\pi d \sin\theta f/c$, where d is a difference between positions of the radiation sources on the board, c is a speed of light, f is a frequency that exceeds a standard frequency, $\theta$ is the preset angle, and $\phi$ is the initial phase difference by position. Generally, each radiation source radiates electromagnetic waves having different frequencies, and may radiate, through the enclosure of the electronic device, several electromagnetic waves having different frequencies, where a frequency that exceeds a standard frequency of a national or international regulation is a frequency that exceeds a standard frequency.

Figure 2:
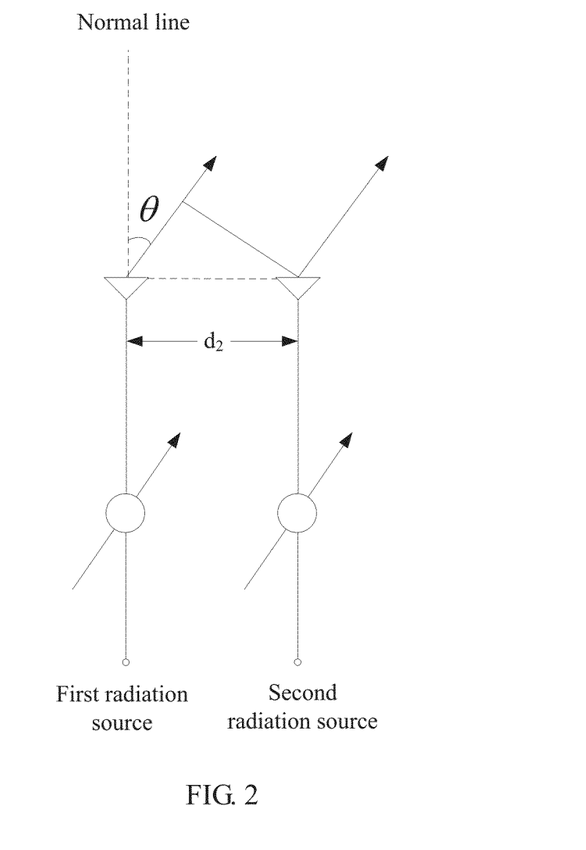
FIG. 2 is a schematic diagram of relative positions of a first radiation source and a second radiation source that are disposed on a board according to an embodiment of the present invention.

The difference between the positions of the at least two radiation sources may be determined according to the positions of the at least two radiation sources on the board. The initial phase difference by position formula is used to calculate an initial phase difference by position between two radiation sources. A specific manner in which the difference between the positions of the at least two radiation sources is determined is as follows:

One of the radiation sources is used as a base radiation source, and the difference between the positions of the at least two radiation sources is a difference between distances from the other radiation source or other radiation sources to the base radiation source. For example, as shown in FIG. 2, a first radiation source and a second radiation source are disposed on the board. The first radiation source is used as the base radiation source, and a difference $d_2$ between positions of the second radiation source and the base radiation source may be determined according to coordinates of the first radiation source and coordinates of the second radiation source on the board. The preset angle is $\theta$. A direction indicated by an arrow may be a direction of the wave-absorbing material, and the preset angle $\theta$ is an included angle between a direction of a normal line of the coordinate system and the direction of the wave-absorbing material. Then, an initial phase difference by position of the second radiation source relative to the base radiation source is $\phi_2=2\pi d_2 \sin\theta f/c$.

Likewise, when a third radiation source is further disposed on the board, a difference $d_3$ between positions of the third radiation source and the base radiation source may be determined according to the coordinates of the first radiation source and coordinates of the third radiation source on the board. Then, an initial phase difference by position of the third radiation source relative to the base radiation source is $\phi_3 = 2\pi d_3 \sin\theta f/c$. Because the first radiation source is used as the base radiation source, an initial phase difference by position of the first radiation source relative to the base radiation source is $\phi_1 = 0$.

By analogy, a difference between positions of an $n^{th}$ radiation source and the base radiation source is $d_n$, and an initial phase difference by position of the $n^{th}$ radiation source relative to the base radiation source is $\phi_n = 2\pi d_n \sin\theta f/c$.

104. Calculate, according to the initial phase difference by position between the at least two radiation sources, determined initial clock phases of the at least two radiation sources when a far-field superimposed field strength is a limiting value.

The determined initial clock phases of the at least two radiation sources when the far-field superimposed field strength is the limiting value are calculated according to the initial phase difference by position between the at least two radiation sources and a far-field superimposed field strength formula.

Generally, there is a function relationship between the far-field superimposed field strength, the initial phase difference by position between the radiation sources, and the determined initial clock phases of the radiation sources. The far-field superimposed field strength formula is $$E = K \sum_{i=1}^{n} a_i e^{j\phi_i} e^{j\varphi_i},$$

where n is the number of radiation sources, E is a far-field superimposed field strength of the radiation sources, $\phi_i$ is a determined initial clock phase of an $i^{th}$ radiation source, $\varphi_i$ is an initial phase difference by position of the $i^{th}$ radiation source relative to a base radiation source, $a_i$ is a far-field field strength of the $i^{th}$ radiation source, and K is a constant coefficient.

The far-field field strength $a_i$ of each radiation source on the board is first determined using a general method; then, the determined far-field field strength $a_i$ of each radiation source and determined initial phase difference by position $\varphi_i$ of each radiation source relative to the base radiation source, as described in step 103, are put into the far-field superimposed field strength formula, and then determined initial clock phase $\phi_i$ of each radiation source when the far-field superimposed field strength of the radiation sources is the limiting value may be determined.

For example, three radiation sources are disposed on the board, which are separately a first radiation source, a second radiation source, and a third radiation source. The first radiation source is used as a base radiation source. A far-field superimposed field strength from the first radiation source to the third radiation source is $$E = K \sum_{i=1}^{3} a_i e^{j\phi_i} e^{j\varphi_i}.$$

As described above, far-field field strengths $a_1$, $a_2$, and $a_3$ of the first radiation source to the third radiation source are determined, and initial phase differences by position $\varphi_1$, $\varphi_2$, and $\varphi_3$ of the first radiation source to the third radiation source are determined according to step 103. Therefore, for the first radiation source to the third radiation source, when the far-field superimposed field strength is a limiting value, determined initial clock phases $\phi_1$, $\phi_2$, and $\phi_3$ of the first radiation source to the third radiation source may be obtained.

When the preset angle is an angle relative to a direction of the wave-absorbing material, a determined initial clock phase when the superimposed field strength is a maximum value is calculated, so that electromagnetic waves that exceed a standard frequency and that are of the at least two radiation sources may be radiated towards the direction of the wave-absorbing material, and may be absorbed by the wave-absorbing material. In this case, the determined initial clock phase may be a first determined initial clock phase.

When the preset angle is corresponding to the direction of the heat dissipation hole, a determined initial clock phase when the superimposed field strength is a minimum value is calculated, so as to prevent electromagnetic waves that exceed the standard frequency and that are of the at least two radiation sources from being radiated through the heat dissipation hole. In this case, the determined initial clock phase is a second determined initial clock phase.

Further, the preset angle may include a first angle and a second angle. The heat dissipation hole includes a first-side-wall heat dissipation hole and a second-side-wall heat dissipation hole. The enclosure includes a first side wall and a second side wall. The first side wall is corresponding to a second side of the board. The second side wall is corresponding to a third side of the board. The first-side-wall heat dissipation hole is a heat dissipation hole disposed in the first side wall. The second-side-wall heat dissipation hole is a heat dissipation hole disposed in the second side wall. That is, the first-side-wall heat dissipation hole is corresponding to the second side of the board. The second-side-wall heat dissipation hole is corresponding to the third side of the board. The first angle is an angle relative to a direction of the first-side-wall heat dissipation hole. The second angle is an angle relative to a direction of the second-side-wall heat dissipation hole. The far-field superimposed field strength formula further includes a first weight value and a second weight value. The first weight value is corresponding to the first angle, and the second weight value is corresponding to the second angle. The first weight value and the second weight value are constants, and may be adjusted according to an actual requirement.

Both a size of a hole diameter of the heat dissipation hole and the number of heat dissipation holes may affect EMI control. When the hole diameter of the heat dissipation hole and a wavelength of radiation are of a same order of magnitude, more heat dissipation holes result in that electromagnetic waves that exceed a standard frequency and that are of a radiation source are more likely to be radiated. Therefore, when the number of first-side-wall heat dissipation holes is greater than the number of second-side-wall heat dissipation holes, the first weight value is set to be greater than the second weight value, so as to prevent, as much as possible, electromagnetic waves that exceed the standard frequency and that are of the radiation source from being radiated through the first-side-wall heat dissipation hole. When the hole diameter of the heat dissipation hole and the wavelength of the radiation are not of a same order of magnitude, a heat dissipation hole having a larger hole diameter results in that electromagnetic waves are more likely to be radiated through the heat dissipation hole. Therefore, when a hole diameter of the first-side-wall heat dissipation hole is greater than a hole diameter of the second-side-wall heat dissipation hole, the first weight value is set to be greater than the second weight value, so as to prevent, as much as possible, electromagnetic waves that exceed the standard frequency and that are of the radiation source from being radiated through the first-side-wall heat dissipation hole.

105. Configure the phase-adjustable clock driver using the determined initial clock phases, so as to adjust initial clock phases of the at least two radiation sources to the determined initial clock phases.

When the determined initial clock phase is the first determined initial clock phase, the phase-adjustable clock driver adjusts the initial clock phases of the at least two radiation sources to the corresponding first determined initial clock phases, so that electromagnetic waves that exceed the standard frequency and that are of the at least two radiation sources are radiated towards the direction of the wave-absorbing material, and is absorbed by the wave-absorbing material. When the determined initial clock phase is the second determined initial clock phase, the phase-adjustable clock driver adjusts the initial clock phases of the at least two radiation sources to the corresponding second determined initial clock phases, so as to prevent electromagnetic waves that exceed the standard frequency and that are of the at least two radiation sources from being radiated through the heat dissipation hole.

Figure 3:
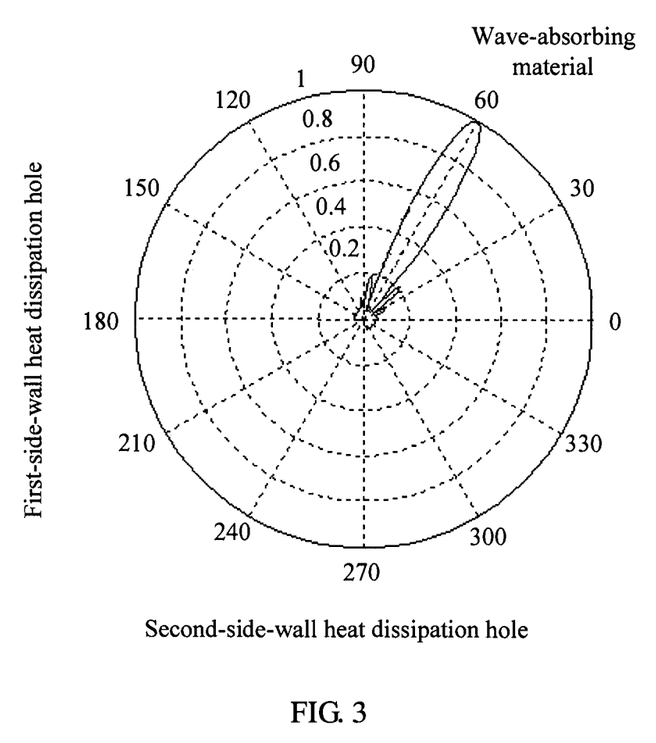
FIG. 3 is a polar-coordinate pattern in which an EMI control method is applied to performing simulation according to an embodiment of the present invention.

FIG. 3 is a 360-degree polar-coordinate pattern, obtained by performing simulation, according to the EMI control method provided by this embodiment of the present invention. Simulation conditions are that radiation sources on the board are evenly distributed on a circle having a radius of 0.3 m, and a frequency that exceeds a standard frequency is 5 Gigahertz (GHZ). The direction of the wave-absorbing material is a 60-degree direction. The origin of the polar-coordinate pattern indicates the board. 0.2, 0.4, 0.6, 0.8, and 1 indicate far-field superimposed field strengths. That is, the far-field superimposed field strengths gradually increase from the origin outwards. A higher field strength leads to higher radiation, and vice versa.

As shown in FIG. 3, a main lobe in the polar-coordinate pattern has a relatively high superimposed field strength, and is corresponding to the 60-degree direction. Therefore, a direction corresponding to the wave-absorbing material has relatively high radiation. Side lobes on both sides of the main lobe has a relatively low superimposed field strength, and are corresponding to both sides of the 60-degree direction, or the first-side-wall heat dissipation hole and the second-side-wall heat dissipation hole. Therefore, radiation corresponding to the first-side-wall heat dissipation hole and the second-side-wall heat dissipation hole is relatively low, and even tiny. Therefore, the present invention implements EMI control of the electronic device.

The number of phase-adjustable clock drivers may be the same as the number of the radiation sources. The electronic device may also include only one phase-adjustable clock driver, that is, one phase-adjustable clock driver is corresponding to multiple radiation sources; in this case, before step 104, the method further includes collecting statistics on delays from the phase-adjustable clock driver to the at least two radiation sources.

Correspondingly, step 104 includes calculating, according to the initial phase difference by position between the at least two radiation sources and the delays from the phase-adjustable clock driver to the at least two radiation sources, determined initial clock phases of the at least two radiation sources when the far-field superimposed field strength is the limiting value.

Intermediate initial clock phases of the at least two radiation sources when the far-field superimposed field strength is the limiting value is first calculated according to the initial phase difference by position between the at least two radiation sources; then, the intermediate initial clock phases are complemented using the delays from the phase-adjustable clock driver to the at least two radiation sources, to obtain the determined initial clock phases, so that the phase-adjustable clock driver adjusts initial clock phases of the at least two radiation sources to the determined initial clock phases.

For example, the delays from the phase-adjustable clock driver to the at least two radiation sources may be $[\tau_1, \tau_2, \tau_3 \ldots \tau_n]$.

The intermediate initial clock phases of the at least two radiation sources when the far-field superimposed field strength is the limiting value are calculated $[\phi_1, \phi_2, \phi_3 \ldots \phi_n]$ according to the initial phase difference by position between the at least two radiation sources; then, after the intermediate initial clock phases are complemented using the delays from the phase-adjustable clock driver to the at least two radiation sources, the obtained determined initial clock phases are $[\phi_1-f\tau_1, \phi_2-f\tau_2, \phi_3-f\tau_3, \ldots \phi_n-f\tau_n]$, where f is the frequency that exceeds the standard frequency, and is the same as the frequency f that exceeds the standard frequency mentioned above.

According to the EMI control method provided in the foregoing implementation manner, positions of at least two radiation sources on a board are determined, a preset angle of the at least two radiation sources is or are determined; an initial phase difference by position between the at least two radiation sources is calculated according to the positions of the at least two radiation sources on the board and the preset angle of the at least two radiation sources; determined initial clock phases of the at least two radiation sources when a far-field superimposed field strength is a limiting value are calculated according to the initial phase difference by position between the at least two radiation sources; and the phase-adjustable clock driver is configured using the determined initial clock phases, so that the phase-adjustable clock driver adjusts initial clock phases of the at least two radiation sources to the determined initial clock phases, thereby implementing adjustment of the initial clock phases of the at least two radiation sources. Therefore, a part having a high superimposed field strength is corresponding to the wave-absorbing material, and a part having a low superimposed field strength is corresponding to the heat dissipation hole, and therefore, EMI control of an electronic device is completed.

Figure 4:
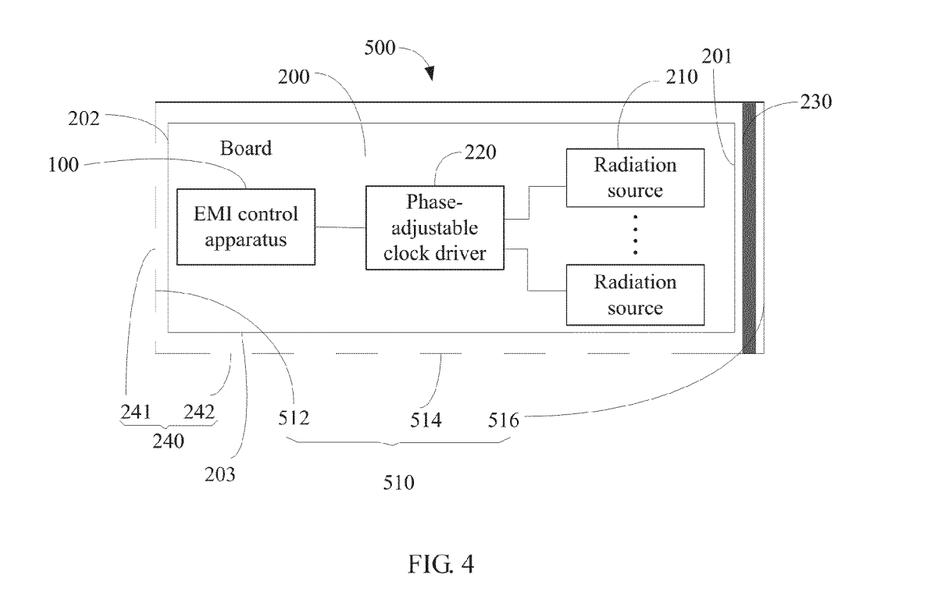
FIG. 4 is a schematic structural diagram of an electronic device according to an embodiment of the present invention.

Further, referring to FIG. 4, an embodiment of the present invention provides an electronic device 500. The electronic device 500 includes an enclosure 510, a board 200, at least two radiation sources 210, a phase-adjustable clock driver 220, a wave-absorbing material 230, and an EMI control apparatus 100. The board 200, the at least two radiation sources 210, the phase-adjustable clock driver 220, the wave-absorbing material 230, and the EMI control apparatus 100 are all disposed inside the enclosure 510.

The at least two radiation sources 210, the phase-adjustable clock driver 220, and the EMI control apparatus 100 are disposed on the board 200. The enclosure 510 is provided with a heat dissipation hole 240, which is configured to implement convection of air inside and outside the enclosure 510, so as to perform heat dissipation on the electronic device 500.

The wave-absorbing material 230 is located between a third side wall 516 (no heat dissipation hole is disposed in the third side wall 516) of the enclosure 510 and a first side 201 of the board 200, to absorb electromagnetic waves radiated by the at least two radiation sources 210.

The phase-adjustable clock driver 220 is connected to the at least two radiation sources 210, and is configured to adjust initial clock phases of the at least two radiation sources 210.

The EMI control apparatus 100 is connected to the phase-adjustable clock driver 220, and is configured to control the phase-adjustable clock driver 220 to adjust the initial clock phases of the at least two radiation sources 210, so as to control EMI of the electronic device 500. The number of phase-adjustable clock drivers 220 is the same as the number of the radiation sources 210.

Figure 5:
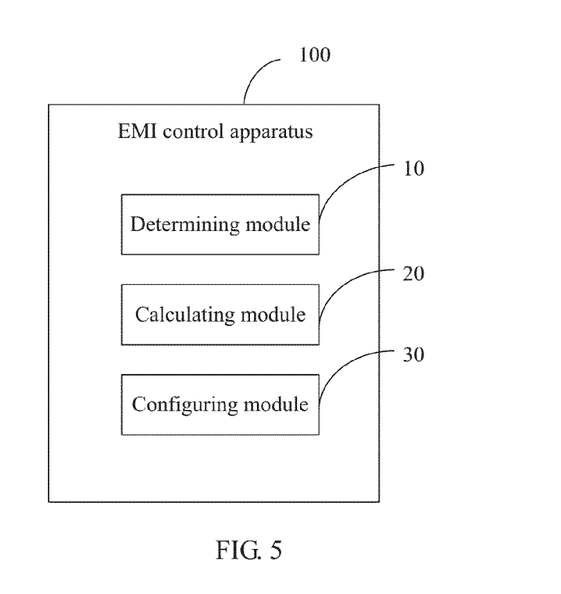
FIG. 5 is a schematic structural diagram of an EMI control apparatus according to an embodiment of the present invention.

Referring to FIG. 5, FIG. 5 is a schematic structural diagram of the EMI control apparatus 100 according to an embodiment of the present invention. The EMI control apparatus 100 includes a determining module 10, a calculating module 20, and a configuring module 30.

The determining module 10 is configured to determine positions of the at least two radiation sources 210 on the board 200, and determine a preset angle of the at least two radiation sources 210.

The at least two radiation sources 210 may be radiating components such as central processing units. An X-Y axis coordinate system is established on a plane of the board 200. The at least two radiation sources 210 have corresponding coordinates in the coordinate system, so that positions of the at least two radiation sources 210 relative to the origin of the X-Y axis coordinate system may be determined.

In this implementation manner, the preset angle may be an angle relative to a direction of the wave-absorbing material 230. That is, the preset angle is an included angle between a direction of a normal line of X-Y axes and the direction of the wave-absorbing material 230. The preset angle may also be an angle relative to a direction of a heat dissipation hole 240. That is, the preset angle is an included angle between the direction of the normal line of the X-Y axes and the direction of the heat dissipation hole 240.

The calculating module 20 is configured to calculate an initial phase difference by position between the at least two radiation sources 210 according to the positions of the at least two radiation sources 210 on the board 200 and the preset angle of the at least two radiation sources 210, and calculate, according to the initial phase difference by position between the at least two radiation sources 210, determined initial clock phases of the at least two radiation sources 210 when a far-field superimposed field strength is a limiting value.

The calculating module 20 is configured to calculate the initial phase difference by position between the at least two radiation sources 210 according to the positions of the at least two radiation sources 210 on the board 200, the preset angle of the at least two radiation sources 210, and an initial phase difference by position formula.

The initial phase difference by position formula is $\phi = 2\pi d \sin\theta f/c$, where d is a difference between positions of the radiation sources 210 on the board 200, c is a speed of light, f is a frequency that exceeds a standard frequency, $\theta$ is the preset angle, and $\phi$ is the initial phase difference by position. Generally, each radiation source 210 radiates electromagnetic waves having different frequencies, and may radiate several electromagnetic waves having different frequencies through the enclosure 510 of the electronic device 500, where a frequency that exceeds a standard frequency of a national or international regulation is a frequency that exceeds a standard frequency.

The difference between the positions of the at least two radiation sources 210 may be determined according to the positions of the at least two radiation sources 210 on the board 200. The initial phase difference by position formula is used to calculate an initial phase difference by position between two radiation sources 210. A specific manner in which the difference between the positions of the at least two radiation sources 210 is determined is as follows.

One of the radiation sources is used as a base radiation source, and the difference between the positions of the at least two radiation sources 210 is a difference between distances from the other radiation source or other radiation sources to the base radiation source. For example, still referring to FIG. 2, a first radiation source and a second radiation source are disposed on the board. The first radiation source is used as the base radiation source, and a difference $d_2$ between positions of the second radiation source and the base radiation source may be determined according to coordinates of the first radiation source and coordinates of the second radiation source on the board. The preset angle is $\theta$. A direction indicated by an arrow may be a direction of the wave-absorbing material, and the preset angle $\theta$ is an included angle between a direction of a normal line of the coordinate system and the direction of the wave-absorbing material. Then, an initial phase difference by position of the second radiation source relative to the base radiation source is $\phi_2 = 2\pi d_2 \sin\theta f/c$.

Likewise, when a third radiation source is further disposed on the board, a difference $d_3$ between each positions of the third radiation source and the base radiation source may be determined according to the coordinates of the first radiation source and coordinates of the third radiation source on the board. Then, an initial phase difference by position of the third radiation source relative to the base radiation source is $\phi_3 = 2\pi d_3 \sin\theta f/c$. Because the first radiation source is used as the base radiation source, an initial phase difference by position of the first radiation source relative to the base radiation source is $\phi_1 = 0$.

By analogy, a difference between positions of an $n^{th}$ radiation source and the base radiation source is $d_n$, and an initial phase difference by position of the $n^{th}$ radiation source relative to the base radiation source is $\phi_n = 2\pi d_n \sin\theta f/c$.

The calculating module 20 is further configured to calculate, according to the initial phase difference by position between the at least two radiation sources 210 and the far-field superimposed field strength formula, determined initial clock phases of the at least two radiation sources 210 when the far-field superimposed field strength is the limiting value.

Generally, there is a function relationship between the far-field superimposed field strength, the initial phase difference by position between the at least two radiation sources 210, and the determined initial clock phases of the at least two radiation sources 210. The far-field superimposed field strength formula is $$E = K \sum_{i=1}^{n} a_i e^{j\phi_i} e^{j\varphi_i},$$

where n is the number of radiation sources, E is a far-field superimposed field strength of the radiation sources, $\phi_i$ is a determined initial clock phase of an $i^{th}$ radiation source, $\phi_i$ is an initial phase difference by position of the $i^{th}$ radiation source relative to a base radiation source, $a_i$ is a far-field field strength of the $i^{th}$ radiation source, and K is a constant coefficient.

The calculating module 20 first determines the far-field field strength $a_i$ of each radiation source 210 on the board 200 using a general method, and puts the determined far-field field strength $a_i$ of each radiation source 210 and determined initial phase difference by position $\phi_i$ of each radiation source 210 relative to the base radiation source into the far-field superimposed field strength formula, and then determined initial clock phases $\phi_i$ of each radiation source 210 when the far-field superimposed field strength of the radiation sources 210 is the limiting value may be determined.

For example, three radiation sources are disposed on the board 200, which are separately a first radiation source, a second radiation source, and a third radiation source. The first radiation source is used as a base radiation source. A far-field superimposed field strength from the first radiation source to the third radiation source is $$E = K \sum_{i=1}^{3} a_i e^{j\phi_i} e^{j\varphi_i}.$$

As described above, the calculating module 20 determines far-field field strengths $a_1$, $a_2$, and $a_3$ of the first to third radiation sources using the general method, and determines initial phase differences by position $\phi_1$, $\phi_2$, and $\phi_3$ of the first radiation source to the third radiation source. Therefore, for the first radiation source to the third radiation source, when the far-field superimposed field strength is a limiting value, determined initial clock phases $\theta_1$, $\theta_2$, and $\theta_3$ of the first radiation source to the third radiation source may be obtained.

When the preset angle is an angle relative to a direction of the wave-absorbing material 230, a determined initial clock phase when the superimposed field strength is a maximum value is calculated, so that electromagnetic waves that exceed a standard frequency and that are of the at least two radiation sources 210 may be radiated towards the direction of the wave-absorbing material 230, and therefore may be absorbed by the wave-absorbing material 230. In this case, the determined initial clock phase may be a first determined initial clock phase.

When the preset angle is an angle relative to the direction of the heat dissipation hole 240, a determined initial clock phase when the superimposed field strength is a minimum value is calculated, so as to prevent electromagnetic waves that exceed a standard frequency and that are of the at least two radiation sources 210 from being radiated through the heat dissipation hole 240. In this case, the determined initial clock phase is a second determined initial clock phase.

Further, the preset angle includes a first angle and a second angle. The heat dissipation hole 240 includes a first-side-wall heat dissipation hole 241 and a second-side-wall heat dissipation hole 242. A first side wall 512 of the enclosure 510 is corresponding to a second side 202 of the board 200. A second side wall 514 of the enclosure 510 is corresponding to a third side 203 of the board 200. The first-side-wall heat dissipation hole 241 is a heat dissipation hole disposed in the first side wall 512. The second-side-wall heat dissipation hole 242 is a heat dissipation hole disposed in the second side wall 514. That is, the first-side-wall heat dissipation hole 241 is corresponding to the second side 202 of the board 200. The second-side-wall heat dissipation hole 242 is corresponding to the third side 203 of the board 200. The first angle is an angle relative to a direction of the first-side-wall heat dissipation hole 241. The second angle is an angle relative to a direction of the second-side-wall heat dissipation hole 242. The far-field superimposed field strength formula further includes a first weight value and a second weight value. The first weight value and the second weight value are constants, where the first weight value is corresponding to the first angle and the second weight value is corresponding to the second angle. Both a size of a hole diameter of the heat dissipation hole and the number of heat dissipation holes may affect EMI control. When the hole diameter of the heat dissipation hole and a wavelength of radiation are of a same order of magnitude, more heat dissipation holes result in that electromagnetic waves that exceed a standard frequency and that are of a radiation source are more likely to be radiated. Therefore, when the number of first-side-wall heat dissipation holes 241 is greater than the number of second-side-wall heat dissipation holes 242, the first weight value is set to be greater than the second weight value, so as to prevent, as much as possible, electromagnetic waves that exceed the standard frequency and that are of the radiation source 210 from being radiated through the first-side-wall heat dissipation hole 241. When the hole diameter of the heat dissipation hole and the wavelength of the radiation are not of a same order of magnitude, a heat dissipation hole having a larger hole diameter results in that electromagnetic waves are more likely to be radiated through the heat dissipation hole. Therefore, when a hole diameter of the first-side-wall heat dissipation hole 241 is greater than a hole diameter of the second-side-wall heat dissipation hole 242, the first weight value is set to be greater than the second weight value, so as to prevent, as much as possible, electromagnetic waves that exceed the standard frequency and that are of the radiation source 210 from being radiated through the first-side-wall heat dissipation hole 241.

The configuring module 30 is configured to configure the determined initial clock phases into the phase-adjustable clock driver 220, so that the initial clock phases of the at least two radiation sources 210 are adjusted to the determined initial clock phases.

When the determined initial clock phase is the first determined initial clock phase, the phase-adjustable clock driver 220 adjusts the initial clock phases of the at least two radiation sources 210 to the first determined initial clock phases, so that electromagnetic waves that exceed the standard frequency and that are of the at least two radiation sources 210 are radiated towards a direction of the wave-absorbing material 230, and is absorbed by the wave-absorbing material 230. When the determined initial clock phase is the second determined initial clock phase, the phase-adjustable clock driver 220 adjusts the initial clock phases of the at least two radiation sources 210 to the second determined initial clock phases, so as to prevent electromagnetic waves that exceed the standard frequency and that are of the at least two radiation sources 210 from being radiated through the heat dissipation hole 240.

Figure 6:
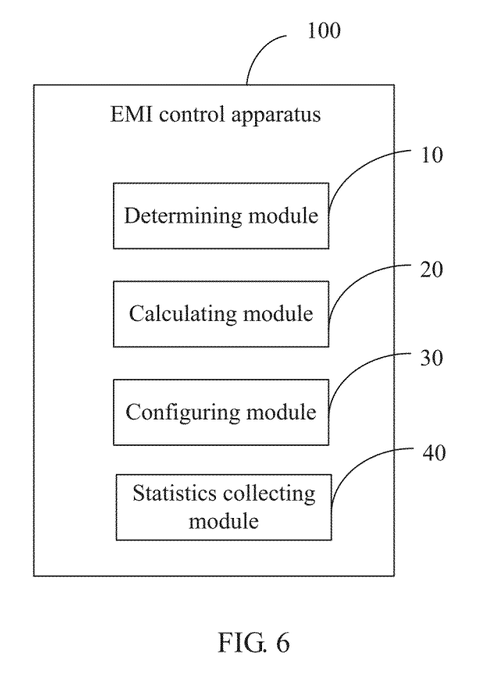
FIG. 6 is a schematic structural diagram of another EMI control apparatus according to an embodiment of the present invention.

Further, referring to FIG. 6, FIG. 6 is a schematic structural diagram of another EMI control apparatus 100 according to an embodiment of the present invention. In this embodiment, the number of phase-adjustable clock drivers 220 in an electronic device 500 is one, and the EMI control apparatus 100 further includes a statistics collecting module 40.

The statistics collecting module 40 is configured to collect statistics on delays from the phase-adjustable clock driver 220 to at least two radiation sources 210.

Correspondingly, the calculating module 20 is configured to calculate an initial phase difference by position between the at least two radiation sources 210 according to positions of the at least two radiation sources 210 on a board 200 and a preset angle of the at least two radiation sources 210; and calculate, according to the initial phase difference by position between the at least two radiation sources 210 and the delays, from the phase-adjustable clock driver 220 to the at least two radiation sources 210, that is or are obtained through statistics by the statistics collecting module 40, determined initial clock phases of the at least two radiation sources 210 when a far-field superimposed field strength is a limiting value.

The calculating module 20 is configured to calculate, according to the initial phase difference by position between the at least two radiation sources 210, intermediate initial clock phases of the at least two radiation sources 210 when the far-field superimposed field strength is the limiting value; and complement the intermediate initial clock phases using the delays from the phase-adjustable clock driver 220 to the at least two radiation sources 210, to obtain the determined initial clock phases, so that the phase-adjustable clock driver 220 adjusts initial clock phases of the at least two radiation sources 210 to the determined initial clock phases.

For example, the delays from the phase-adjustable clock driver 220 to the at least two radiation sources 210 may be [$\tau_1, \tau_2, \tau_3 \ldots \tau_n$].

The intermediate initial clock phases of the at least two radiation sources 210 when the far-field superimposed field strength is the limiting value are calculated as [$\phi_1, \phi_2, \phi_3 \ldots \phi_n$] according to the initial phase difference by position between the at least two radiation sources 210; then, after the intermediate initial clock phases are complemented using the delays from the phase-adjustable clock driver 220 to the at least two radiation sources 210, the obtained determined initial clock phases are [$\phi_1-f\tau_1, \phi_2-f\tau_2, \phi_3-f\tau_3, \ldots \phi_n-f\tau_n$], where f is the frequency that exceeds the standard frequency, which is the same as the frequency that exceeds the standard frequency f mentioned above.

In this embodiment of the present invention, an EMI control apparatus 100 adjusts initial clock phases of at least two radiation sources 210 on an electronic device 500, so that electromagnetic waves that exceed a standard frequency and that are of the at least two radiation sources 210 propagate towards a direction of a wave-absorbing material 230 and are absorbed by the wave-absorbing material 230; in addition the electromagnetic waves having a frequency that exceeds a standard frequency are prevented from propagating towards a direction of a heat dissipation hole 240, and therefore, EMI control of the electronic device 500 is implemented.

Figure 7:
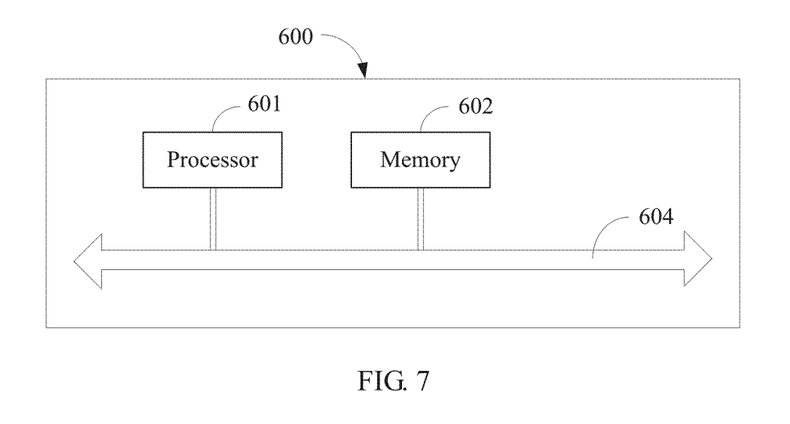
FIG. 7 is a schematic structural diagram of still another EMI control apparatus according to an embodiment of the present invention.

Referring to FIG. 7, FIG. 7 is a schematic structural diagram of still another EMI control apparatus 600 according to an embodiment of the present invention. The EMI control apparatus 600 includes a processor 601, a memory 602, and a bus 604.

The processor 601 and the memory 602 are connected to each other using the bus 604. The bus 604 may be a peripheral component interconnect (PCI) bus, an extended industry standard architecture (EISA) bus, or the like. The bus may be classified into an address bus, a data bus, a control bus, and the like. For convenience of denotation, the bus is represented using one bold line in FIG. 7; however, it does not indicate that there is only one bus or only one type of buses.

The memory 602 is configured to store a program. The program may include program code. The program code includes computer operation instructions. The memory 602 may include a high-speed random access memory (RAM), and may further include a non-volatile memory, for example, at least one disk memory.

The processor 601 executes the program stored by the memory 602, so as to implement the EMI control method provided by this embodiment of the present invention, which includes determining positions of at least two radiation sources on a board; determining a preset angle of the at least two radiation sources; calculating an initial phase difference by position between the at least two radiation sources according to the positions of the at least two radiation sources on the board and the preset angle of the at least two radiation sources; calculating, according to the initial phase difference by position between the at least two radiation sources, determined initial clock phases of the at least two radiation sources when a far-field superimposed field strength is a limiting value; and configuring a phase-adjustable clock driver using the determined initial clock phases.

The processor 601 may be a general processor, including a central processing unit (CPU), a network processor (NP), and the like. The processor 601 may also be a digital signal processor (DSP), an application-specific integrated circuit (ASIC), a field-programmable gate array (FPGA), or another programmable logical component.

Refer to the method shown in FIG. 1 of the present invention for a specific EMI control method.

What is disclosed above are merely exemplary embodiments of the present invention, and definitely cannot be regarded as to limit the protection scope of the present invention. Those skilled in the art can understand all or a part of processes that implement the foregoing embodiments and equivalent modifications made in accordance with the claims of the present invention shall fall within the scope of the present invention.

What is claimed is:

1. An electromagnetic interference control method used to control electromagnetic interference of an electronic device, wherein the electronic device comprises a board, at least two radiation sources, and a phase-adjustable clock driver, the at least two radiation sources and the phase-adjustable clock driver are disposed on the board, the method comprising:
   determining positions of the at least two radiation sources on the board;
   determining a preset angle of the at least two radiation sources;
   calculating an initial phase difference by position between the at least two radiation sources according to the positions of the at least two radiation sources on the board and the preset angle of the at least two radiation sources;
   calculating, according to the initial phase difference by position between the at least two radiation sources, determined initial clock phases of the at least two radiation sources when a far-field superimposed field strength is a limiting value; and
   configuring the phase-adjustable clock driver using the determined initial clock phases.

2. The method according to claim 1, wherein the electronic device further comprises a wave-absorbing material, wherein the wave-absorbing material is disposed on a first side of the board, and wherein, when the preset angle is an angle relative to a direction of the wave-absorbing material, the determined initial clock phases of the at least two radiation sources, when the far-field superimposed field strength is a maximum limiting value, are calculated, so that electromagnetic waves that exceed a standard frequency and that are radiated by the at least two radiation sources are absorbed by the wave-absorbing material.

3. The method according to claim 1, wherein the electronic device further comprises an enclosure, wherein the board is disposed inside the enclosure, wherein the enclosure is provided with a heat dissipation hole, and wherein, when the preset angle is an angle relative to a direction of the heat dissipation hole, the determined initial clock phases of the at least two radiation sources, when the far-field superimposed field strength is a minimum limiting value, are calculated, so as to prevent electromagnetic waves that exceed a standard frequency and that are of the at least two radiation sources from being radiated through the heat dissipation hole of the enclosure.

4. The method according to claim 3, wherein the enclosure comprises a first side wall and a second side wall, wherein the first side wall corresponds to a second side of the board, and wherein the second side wall corresponds to a third side of the board, wherein the heat dissipation hole comprises a first-side-wall heat dissipation hole and a second-side-wall heat dissipation hole, wherein the first-side-wall heat dissipation hole is disposed in the first side wall, and wherein the second-side-wall heat dissipation hole is disposed in the second side wherein the preset angle comprises a first angle and a second angle, wherein the first angle is an angle relative to a direction of the first-side-wall heat dissipation hole, and wherein the second angle is an angle relative to a direction of the second-side-wall heat dissipation hole, and wherein a far-field superimposed field strength formula comprises a first weight value and a second weight value, wherein the first weight value corresponds to the first angle, wherein the second weight value corresponds to the second angle, wherein the first weight value and the second weight value are constants, and wherein, when a hole diameter of the first-side-wall heat dissipation hole is greater than a hole diameter of the second-side-wall heat dissipation hole, the first weight value is greater than the second weight value.

5. The method according to claim 1, wherein after calculating, according to the initial phase difference by position between the at least two radiation sources, the determined initial lock phases of the at least two radiation sources when the far-field superimposed field strength is the limiting value, the method further comprises collecting statistics on delays from the phase-adjustable clock driver to the at least two radiation sources, and wherein calculating, according to the initial phase difference by position between the at least two radiation sources, the determined initial clock phases of the at least two radiation sources when the far-field superimposed field strength is the limiting value further comprises calculating, according to the initial phase difference by position between the at least two radiation sources and the delays from the phase-adjustable clock driver to the at least two radiation sources, the determined initial clock phases of the at least two radiation sources when the far-field superimposed field strength is the limiting value.

6. An electromagnetic interference control apparatus configured to control electromagnetic interference of an electronic device, wherein the electronic device comprises a board, at least two radiation sources, and a phase-adjustable clock driver, wherein the at least two radiation sources and the phase-adjustable clock driver are disposed on the board, the apparatus comprising:
a determining module configured to determine positions of the at least two radiation sources on the board, and determine a preset angle of the at least two radiation sources;
a calculating module configured to calculate an initial phase difference by position between the at least two radiation sources according to the positions of the at least two radiation sources on the board and the preset angle of the at least two radiation sources, and calculate determined initial clock phases of the at least two radiation sources when a far-field superimposed field strength is a limiting value; and
a configuring module configured to configure the phase-adjustable clock driver by using the determined initial clock phases.

7. The apparatus according to claim 6, wherein the electronic device further comprises a wave-absorbing material, wherein the wave-absorbing material is disposed on a first side of the board, wherein the preset angle is an angle relative to a direction of the wave-absorbing material, and wherein the calculating module is further configured to calculate determined initial clock phases of the at least two radiation sources when the far-field superimposed field strength is a maximum value, so that electromagnetic waves that exceed a standard frequency and that are of the at least two radiation sources are absorbed by the wave-absorbing material.

8. The apparatus according to claim 6, wherein the electronic device further comprises an enclosure, wherein the board is disposed inside the enclosure, wherein the enclosure is provided with a heat dissipation hole, wherein the preset angle is an angle relative to a direction of the heat dissipation hole, and wherein the calculating module is further configured to calculate determined initial clock phases of the at least two radiation sources when the far-field superimposed field strength is a minimum value, so as to prevent electromagnetic waves that exceed a standard frequency and that are of the at least two radiation sources from being radiated, through the heat dissipation hole, out of the enclosure.

9. The apparatus according to claim 6 further comprising a statistics collecting module configured to collect statistics on delays from the phase-adjustable clock driver to the at least two radiation sources, wherein the calculating module is further configured to calculate, according to the initial phase difference by position between the at least two radiation sources and the delays from the phase-adjustable clock driver to the at least two radiation sources, the determined initial clock phases of the at least two radiation sources when the far-field superimposed field strength is the limiting value.

10. An electronic device comprising:
an enclosure;
a board;
at least two radiation sources;
a phase-adjustable clock driver;
a wave-absorbing material; and
an electromagnetic interference control apparatus, wherein the board, the at least two radiation sources, the phase-adjustable clock driver, the wave-absorbing material, and the electromagnetic interference control apparatus are all disposed inside the enclosure, wherein the at least two radiation sources, the phase-adjustable clock driver, and the electromagnetic interference control apparatus are disposed on the board, wherein the enclosure is provided with a heat dissipation hole, wherein the wave-absorbing material is located between a surface that is of the enclosure and has no heat dissipation hole and a first side of the board, so as to absorb electromagnetic waves radiated by the at least two radiation sources, and wherein the phase-adjustable clock driver is connected to the at least two radiation sources and configured to adjust initial clock phases of the at least two radiation sources.

11. The electronic device according to claim 10, wherein the electromagnetic interference control apparatus is configured to control electromagnetic interference of the electronic device, and wherein the electromagnetic interference control apparatus comprises:
a determining module; configured to determine positions of the at least two radiation sources on the board, and determine a preset angle of the at least two radiation sources;
a calculating module; configured to calculate an initial phase difference by position between the at least two radiation sources according to the positions of the at least two radiation sources on the board and the preset angle of the at least two radiation sources, and calculate determined initial clock phases of the at least two radiation sources when a far-field superimposed field strength is a limiting value; and a configuring module configured to configure the phase-adjustable clock driver using the determined initial clock phases.

12. The electronic device according to claim 11, wherein the preset angle is an angle relative to a direction of the wave-absorbing material, and wherein the calculating module is configured to calculate determined initial clock phases of the at least two radiation sources when the far-field superimposed field strength is a maximum limiting value, so that electromagnetic waves that exceed a standard frequency and that are of the at least two radiation sources are absorbed by the wave-absorbing material.

13. The electronic device according to claim 11, wherein the enclosure is provided with a heat dissipation hole, wherein the preset angle is an angle relative to a direction of the heat dissipation hole, and wherein the calculating module is configured to calculate determined initial clock phases of the at least two radiation sources when the far-field superimposed field strength is a minimum limiting value, so as to prevent electromagnetic waves that exceed a standard frequency and that are of the at least two radiation sources from being radiated, through the heat dissipation hole, out of the enclosure.

14. The electronic device according to claim 11, wherein the electromagnetic interference control apparatus further comprises statistics collecting module configured to collect statistics on delays from the phase-adjustable clock driver to the at least two radiation sources, and wherein the calculating module is further configured to calculate, according to the initial phase difference by position between the at least two radiation sources and the delays from the phase-adjustable clock driver to the at least two radiation sources, the determined initial clock phases of the at least two radiation sources when the far-field superimposed field strength is the limiting value.

* * * * *